United States Patent
Lee et al.

(10) Patent No.: US 8,110,892 B2
(45) Date of Patent: Feb. 7, 2012

(54) SEMICONDUCTOR DEVICE HAVING A PLURALITY OF REPAIR FUSE UNITS

(75) Inventors: Jeong-Woo Lee, Gyeonggi-do (KR);
Hyung-Dong Lee, Gyeonggi-do (KR);
Sang-Hoon Shin, Gyeonggi-do (KR);
Hyang-Hwa Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 98 days.

(21) Appl. No.: 12/649,452

(22) Filed: Dec. 30, 2009

(65) Prior Publication Data
US 2011/0006391 A1  Jan. 13, 2011

(30) Foreign Application Priority Data
Jul. 10, 2009  (KR) .................. 10-2009-0062905

(51) Int. Cl.
*H01L 23/52* (2006.01)
(52) U.S. Cl. ........ 257/529; 257/774; 257/776; 257/686; 257/777; 438/109; 438/667; 438/639
(58) Field of Classification Search .............. 257/529, 257/774, 776, 773, 678, 686, 723, 777; 438/109, 438/110, 106, 667, 639
See application file for complete search history.

(56) References Cited

U.S. PATENT DOCUMENTS

| | | | | |
|---|---|---|---|---|
| 7,111,149 | B2 * | 9/2006 | Eilert | 711/220 |
| 2008/0220565 | A1 * | 9/2008 | Hsu et al. | 438/109 |
| 2009/0003103 | A1 * | 1/2009 | Shimizu et al. | 365/201 |
| 2011/0110064 | A1 * | 5/2011 | Foster et al. | 361/803 |

FOREIGN PATENT DOCUMENTS

| | | |
|---|---|---|
| KR | 1019980080540 | 11/1998 |
| KR | 1020010035643 | 5/2001 |
| KR | 1020030004031 | 1/2003 |
| KR | 1020080035208 | 4/2008 |

OTHER PUBLICATIONS

Notice of Preliminary Rejection issued from Korean Intellectual Property Office on Apr. 14, 2011.
Notice of Allowance issued from Korean Intellectual Property Office on Jun. 21, 2011.

* cited by examiner

*Primary Examiner* — Ha Tran T Nguyen
*Assistant Examiner* — Thanh Y. Tran
(74) *Attorney, Agent, or Firm* — IP & T Group LLP

(57) ABSTRACT

A semiconductor device includes a plurality of stacked semiconductor chips; and a plurality of through-silicon vias (TSVs) including first TSVs and redundant TSVs and configured to commonly transfer a signal to the plurality of stacked semiconductor chips. At least one of the semiconductor chips includes a plurality of repair fuse units configured to store defect information as to at least one defect of the TSVs; and a plurality of latch units allocated to the respective TSVs and configured to store a plurality of signals indicating at least one TSV defect and outputted from the plurality of repair fuse units.

6 Claims, 2 Drawing Sheets

SEMICONDUCTOR DEVICE HAVING A PLURALITY OF REPAIR FUSE UNITS

CROSS-REFERENCE TO RELATED APPLICATIONS

The present application claims priority of Korean Patent Application No. 10-2009-0062905, filed on Jul. 10, 2009, which is incorporated herein by reference in its entirety.

BACKGROUND OF THE INVENTION

Exemplary embodiments of the present invention relate to a semiconductor design technology, and more particularly, to a technology which processes information indicating whether through chip vias are defective.

In order to highly integrate a semiconductor device, various types of package methods have been proposed. In a chip stack method in which a plurality of semiconductor chips are stacked to form a semiconductor device, a through-chip-via is used to commonly transfer a signal to a plurality of semiconductor chips. In general, since semiconductor chips are fabricated of a silicon wafer, the through-chip-via is also called a Through-Silicon-Via (TSV).

When a defect occurs in a TSV, a repair operation is performed to substitute a normal TSV with a redundant TSV. The defect information of the TSV is desired to be provided to an internal circuit, in order to ensure normal operations of the semiconductor device. In other words, the internal circuit of the semiconductor device receiving information as to the defect selectively drives TSVs which may transfer a signal, among the plurality of SVs. That is, the internal circuit selectively drives the redundant TSVs and the normal TSVs. Therefore, the semiconductor device fabricated by the chip stack method is desired to be provided with a circuit capable of effectively transferring information as to defects of the TSVs.

SUMMARY OF THE INVENTION

An embodiment of the present invention is directed to a semiconductor device which stores defect information of TSVs outputted from repair fuse units into a plurality of latch units.

Another embodiment of the present invention is directed to a semiconductor device which stores defect information of TSVs outputted from repair fuse units into a plurality of latch units, and sequentially transfers the defect information through a defect information transfer TSV.

In accordance with an embodiment of the present invention, a semiconductor device includes: a plurality of stacked semiconductor chips; and a plurality of TSVs including first TSVs and redundant TSVs and configured to commonly transfer a signal to the plurality of stacked semiconductor chips. At least one of the semiconductor chips includes: a plurality of repair fuse units configured to store information as to at least one defect of the TSVs; and a plurality of latch units allocated to the respective TSVs and configured to store a plurality of signals indicating at least one TSV defect and outputted from the plurality of repair fuse units.

In accordance with another embodiment of the present invention, a semiconductor device includes: a plurality of stacked semiconductor chips; a plurality of TSVs including first TSVs and redundant TSVs and configured to commonly transfer a signal to the plurality of semiconductor chips; a plurality of repair fuse units provided in the respective semiconductor chips and configured to store information indicating at least one defect of the TSVs; and a TSV selection unit configured to selectively drive the plurality of TSVs depending on the stored defect information. The TSV selection unit selectively drives redundant TSVs and first TSVs, each of the semiconductor chips includes a plurality of latch units configured to store a plurality of signals indicating at least one TSV defect, outputted from the corresponding repair fuse units and allocated to the respective TSVs, and the plurality of TSV defect information signals are sequentially transferred to the TSV selection unit through a TSV for transferring the defect information.

DESCRIPTION OF SPECIFIC EMBODIMENTS

Figure 1:
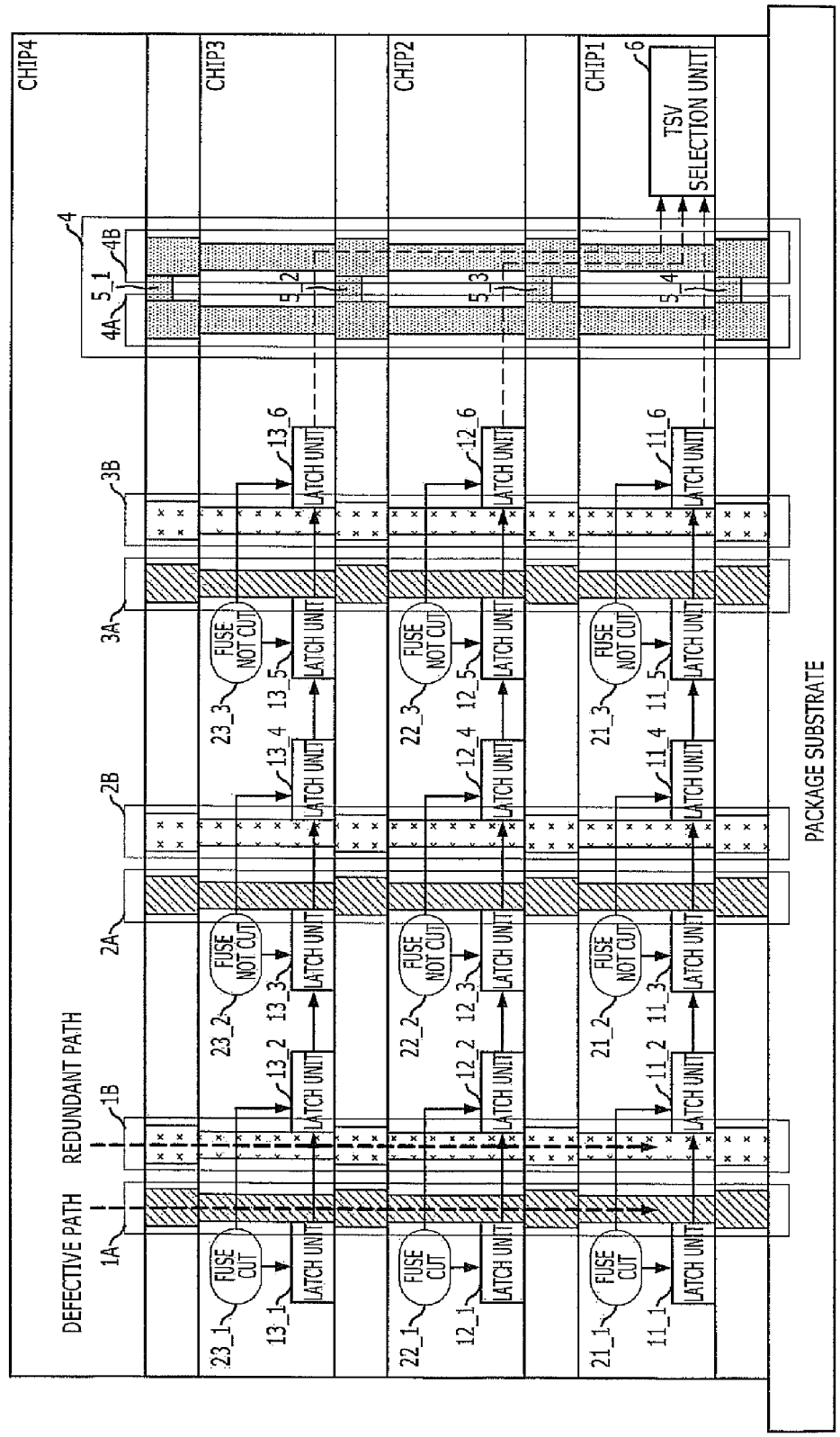
FIG. 1 is a diagram conceptually illustrating the cross section of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In general, logic signals and binary data of a circuit have a high level or a low level, depending on the logic levels thereof, and may be represented by "1" or "0". Furthermore, the logic signals and data may have a high-impedance (Hi-Z) state, if necessary.

FIG. 1 is a diagram conceptually illustrating the cross section of a semiconductor device in accordance with an embodiment of the present invention.

Referring to FIG. 1, the semiconductor device includes a plurality of stacked semiconductor chips CHIP1 to CHIP4, a plurality of normal TSVs 1A to 3A, a plurality of redundant TSVs 1B to 3B, a plurality of repair fuse units 21_1 to 21_3, 22_1 to 22_3, and 23_1 to 23_3, and a TSV selection unit 6. The plurality of TSVs 1A-1B, 2A-2B, and 3A-3B are configured to commonly transfer a signal to the plurality of semiconductor chips CHIP1 to CHIP4. The plurality of repair fuse units 21_1 to 21_3, 22_1 to 22_3, and 23_1 to 23_3 are provided in the respective semiconductor chips to store information as to defects in the TSVs. The TSV selection unit 6 is configured to selectively drive the plurality of TSVs 1A-1B, 2A-2B, and 3A-3B in accordance with the defect information of the repair fuse units 21_1 to 21_3, 22_1 to 22_3, and 23_1 to 23_3. In this case, the TSV selection unit 6 selectively drives redundant TSVs and normal TSVs.

The plurality of stacked semiconductor chips CHIP1 to CHIP3 include a plurality of latch units 11_1 to 11_6, 12_1 to 12_6, and 13_1 to 13_6, respectively, which are configured to store a plurality of TSV defect information signals (that is, signals indicating defects in TSVs) outputted from the corresponding repair fuse units. The latch units are allocated to the respective TSVs. The plurality of TSV defect information signals stored in the plurality of latch units 11_1 to 11_6, 12_1 to 12_6, and 13_1 to 13_6 are sequentially transferred to the TSV selection unit 6 through a defect information transfer TSV 4.

In this embodiment of the present invention, it has been described that each of the semiconductor chips CHIP1 to CHIP4 includes the plurality of repair fuse units and the plurality of latch units. However, it is also possible that any one or more of the semiconductor chips includes the plurality of repair fuse units and the plurality of latch units based on design needs.

The operation of the semiconductor device configured in such a manner will be described as follows.

The plurality of latch units 11_1 to 11_6, 12_1 to 12_6, and 13_1 to 13_6 provided in the respective semiconductor chips store a plurality of TSV defect information signals outputted from the repair fuse units of the corresponding semiconductor chip, and sequentially outputs the TSV defect information signals. That is, the plurality of latch units of the corresponding memory chip, which are implemented as shift registers, store a plurality of TSV defect information signals outputted from the corresponding repair fuse units, and then sequentially transfer the stored signals to the defect information transfer TSV 4.

In the following description, it is assumed that a defect has occurred in the first normal TSV 1A among the plurality of TSVs 1A-1B, 2A-2B, and 3A-3B, and the first normal TSV 1A is repaired by using the first redundant TSV 1B.

The first normal TSV 1A for commonly transferring a signal to the plurality of semiconductor chips CHIP1 to CHIP4 physically connects the plurality of semiconductor chips CHIP1 to CHIP4. Therefore, even when a defect occurs in only a portion of the first normal TSV 1A passing through a specific semiconductor chip, a repair operation for the normal TSV 1A is performed in all of the semiconductor chips CHIP1 to CHIP4 such that the normal TSV 1A is substituted with the first redundant TSV 1B. Therefore, repair fuses included in the repair fuse units 21_1 to 23_1 of the respective semiconductor chips, which are allocated to the first normal TSV 1A, are cut by the repair operation and indicate that a repair has occurred for the respective semiconductor chips.

As an example, the internal operations of the repair fuse units 23_1 to 23_3 and the latch units 13_1 to 13_6 provided in the third semiconductor chip CHIP3 will be described. The repair fuse units 23_1 to 23_3 output a plurality of TSV defect information signals that indicate whether the repair fuses are cut or not, and the latch units 13_1 to 13_6 store the outputted TSV defect information signals. Then, the latch units 13_1 to 13_6 sequentially transfer the stored signals to the defect information transfer TSV 4, and the transferred defect information signals are provided to the TSV selection unit 6 through the defect information transfer TSV 4.

Through the plurality of TSV defect information signals, the TSV selection unit 6 selectively drives TSVs for transferring a signal, among the plurality of TSVs 1A-1B, 2A-2B, and 3A-3B. That is, the TSV selection unit 6 selectively drives the redundant TSVs and the normal TSV (which operates in normal conditions), in order to commonly transfer a signal to the plurality of semiconductor chips CHIP1 to CHIP4.

According to an example, the defect information transfer TSV 4 which sequentially transfers the plurality of TSV defect information signals includes a plurality of TSVs (4A and 4B) which are connected through a plurality of connection lines 5_1 to 5_4 in parallel (for example, by using a multi-parallel method). Therefore, reliability for accurately transferring the signals further increases. In such a parallel connection method, however, a large area is occupied. Therefore, the TSVs for transferring the TSV defect information signals may be configured through a single connection line or multiple parallel connection lines as appropriate.

Figure 2:
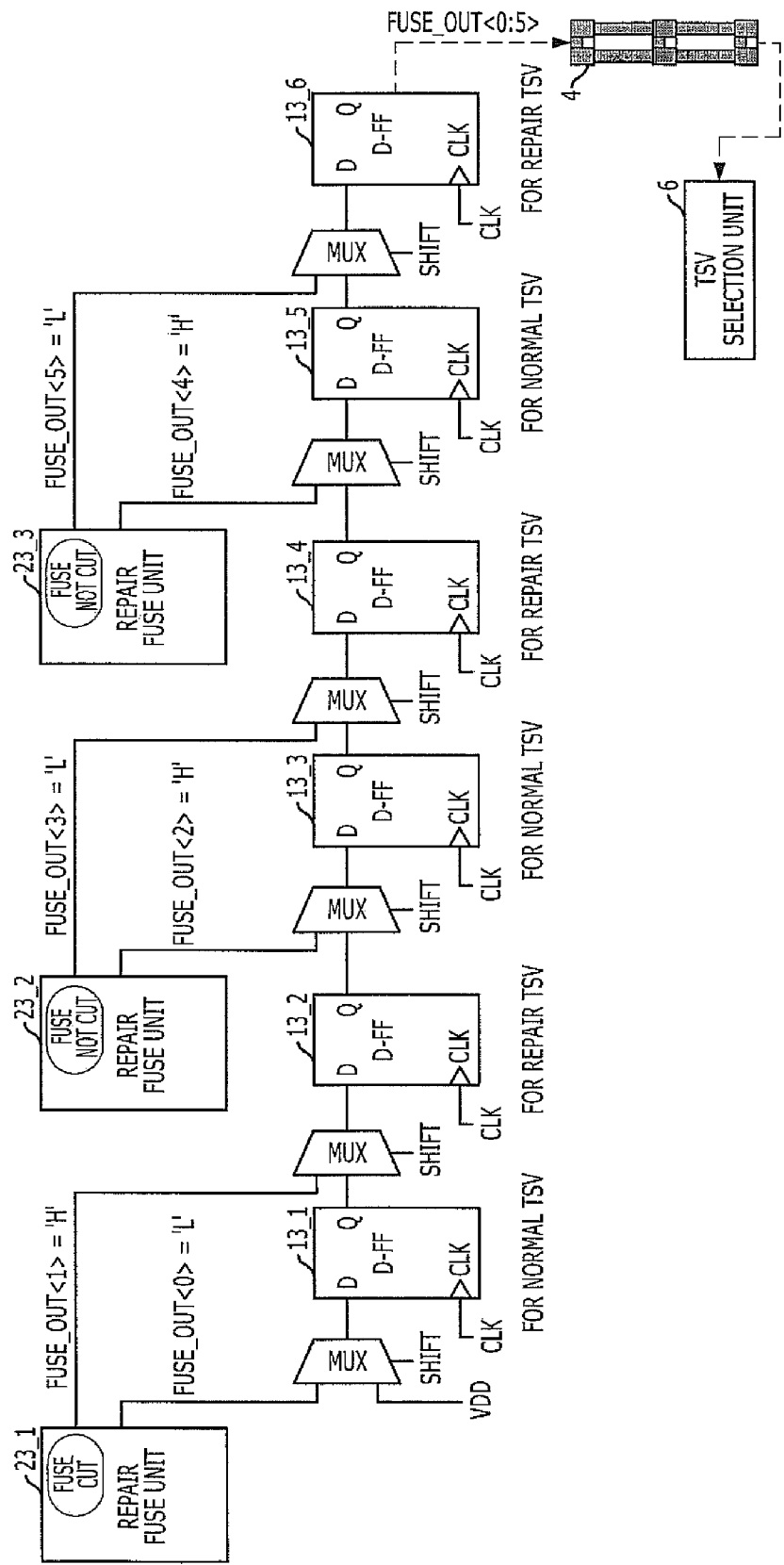
FIG. 2 illustrates an internal circuit of the semiconductor device of FIG. 1.

FIG. 2 illustrates an internal circuit of the semiconductor device of FIG. 1.

Referring to FIG. 2, the internal operations of the repair fuse units 23_1 to 23_3 and the latch units 13_1 to 13_6 provided in the third semiconductor chip CHIP3 are described in detail.

The repair fuse units 23_1 to 23_3 output a plurality of TSV defect information signals FUSE_OUT<0:5> corresponding to whether the repair fuses are cut or not, and the latch units 13_1 to 13_6 store the plurality of TSV defect information signals FUSE_OUT<0:5> outputted from the repair fuse units 23_1 to 23_3.

Since the repair fuse of the first repair fuse unit 23_1 is cut, the first TSV defect information signal FUSE_OUT<0> having a low level is transferred to the first latch unit 13_1 allocated to the first normal TSV 1A, and the second TSV defect information signal FUSE_OUT<1> having a high level is transferred to the second latch unit 13_2 allocated to the first redundant TSV 1B.

Since the repair fuse of the second repair fuse unit 23_2 is not cut, the third TSV defect information signal FUSE_OUT<2> having a high level is transferred to the third latch unit 13_3 allocated to the second normal TSV 2A, and the fourth TSV defect information signal FUSE_OUT<3> having a low level is transferred to the fourth latch unit 13_4 allocated to the second redundant TSV 2B.

Since the repair fuse of the third repair fuse unit 23_3 is not cut, the fifth TSV defect information signal FUSE_OUT<4> having a high level is transferred to the fifth latch unit 13_5 allocated to the third normal TSV 3A, and the sixth TSV defect information signal FUSE_OUT<5> having a low level is transferred to the sixth latch unit 136 allocated to the third redundant TSV 3B.

When a shift signal SHIFT is activated, a plurality of multiplexers MUX, while not transferring the output signals of the repair fuse units 23_1 to 23_3 to the latch units 13_1 to 13_6, transfer signals outputted from the latch units to each other to shift the signals through the latch units. When the shift signal SHIFT is activated, the latch units 13_1 to 13_6 operate like shift registers, and sequentially transfer the stored signals through the defect information transfer TSV 4. The plurality of TSV defect information signals FUSE_OUT<0:5> transferred through the defect information transfer TSV 4 are finally provided to the TSV selection unit 6. Through the plurality of TSV defect information signals FUSE_OUT<0:5>, the TSV selection unit 6 selectively drives TSVs among the plurality of TSVs 1A-1B, 2A-2B, and 3A-3B for transferring a signal. That is, the TSV selection unit 6 selectively drives the redundant TSVs and the normal TSV for transferring signals, in order to commonly transfer a signal to the plurality of semiconductor chips CHIP1 to CHIP4.

The semiconductor device in accordance with the embodiment of the present invention may store the defect information (that is, information as to defects) of the TSVs in the plurality of latch units. Furthermore, the semiconductor device sequentially receives the defect information of the TSVs and then selectively drive the TSVs among the plurality of TSVs for transferring a signal.

While the present invention has been described with respect to the specific embodiments, it will be apparent to those skilled in the art that various changes and modifications may be made without departing from the spirit and scope of the invention as defined in the following claims. For example, additional components may be used in addition to the abovedescribed components of the exemplary embodiments of the present invention. Furthermore, the polarity of active high or active low for indicating an activation state of signal or circuit may be changed depending on different design needs. Furthermore, in implementing a same function, different configuration of transistors/elements may be used depending on different design needs.

In other words, PMOS transistors and NMOS transistors may be substituted for each other, and various types of transistors may be used as needed. Furthermore, logic gate combinations may be changed in implementing a same function. For example, NAND unit or NOR unit may be implemented by various combinations of NAND gates, NOR gates, and inverters. Such modifications would be apparent to those skilled in the art. Therefore, the enumeration thereof is omitted.

What is claimed is:

1. A semiconductor device comprising:
   a plurality of stacked semiconductor chips; and
   a plurality of through-silicon vias (TSV) comprising first TSVs and redundant TSVs and configured to commonly transfer a signal to the plurality of stacked semiconductor chips,
   wherein at least one of the semiconductor chips comprises:
      a plurality of repair fuse units configured to store information as to at least one defect of the TSVs; and
      a plurality of latch units allocated to the respective TSVs and configured to store a plurality of signals indicating at least one TSV defect and outputted from the plurality of repair fuse units.

2. The semiconductor device of claim 1, wherein the plurality of latch units each comprise a shift register configured to be controlled by a clock signal.

3. The semiconductor device of claim 1, further comprising a TSV selection unit configured to sequentially receive the stored plurality of signals indicating at least one TSV defect, and selectively drive the plurality of TSVs, wherein the TSV selection unit selectively drives redundant TSVs and the first TSVs.

4. A semiconductor device comprising:
   a plurality of stacked semiconductor chips;
   a plurality of through-silicon vias (TSVs) comprising first TSVs and redundant TSVs and configured to commonly transfer a signal to the plurality of semiconductor chips;
   a plurality of repair fuse units provided in the respective semiconductor chips and configured to store information indicating at least one defect of the TSVs; and
   a TSV selection unit configured to selectively drive the plurality of TSVs depending on the stored defect information, wherein the TSV selection unit selectively drives redundant TSVs and first TSVs,
   each of the semiconductor chips comprises a plurality of latch units configured to store a plurality of signals indicating at least one TSV defect, outputted from the corresponding repair fuse units and allocated to the respective TSVs, and
   the plurality of TSV defect information signals are sequentially transferred to the TSV selection unit through a TSV for transferring the defect information.

5. The semiconductor device of claim 4, wherein the plurality of latch units each comprise a shift register configured to be controlled by a clock signal.

6. The semiconductor device of claim 4, wherein the defect information transfer TSV comprises a plurality of TSVs connected through a plurality of connection lines by using a multi-parallel method.

* * * * *